(12) United States Patent
Aikenhead

(10) Patent No.: US 8,478,217 B2
(45) Date of Patent: Jul. 2, 2013

(54) RADIO SCANNER FOR SPORTING EVENTS

(75) Inventor: Glen Aikenhead, Mooresville, NC (US)

(73) Assignee: Track Scan, Inc., Mooresville, NC (US)

( * ) Notice: Subject to any disclaimer, the term of this patent is extended or adjusted under 35 U.S.C. 154(b) by 387 days.

(21) Appl. No.: 11/464,997

(22) Filed: Aug. 16, 2006

(65) Prior Publication Data

US 2007/0178861 A1  Aug. 2, 2007

Related U.S. Application Data

(60) Provisional application No. 60/762,495, filed on Jan. 27, 2006.

(51) Int. Cl.
*H04B 1/18* (2006.01)

(52) U.S. Cl.
USPC ............... 455/161.1; 455/90.3; 455/168.1; 455/558

(58) Field of Classification Search
USPC .................................................. 455/161.1
See application file for complete search history.

(56) References Cited

U.S. PATENT DOCUMENTS

| | | | | |
|---|---|---|---|---|
| 4,496,148 A | * | 1/1985 | Morstain et al. | 463/9 |
| 4,521,915 A | | 6/1985 | Baker et al. | |
| 4,888,815 A | * | 12/1989 | Ahlemeyer et al. | 455/168.1 |
| 5,508,695 A | | 4/1996 | Nelson et al. | |
| 5,654,719 A | * | 8/1997 | Kunii | 342/451 |
| 5,946,635 A | * | 8/1999 | Dominguez | 455/558 |
| 6,055,419 A | | 4/2000 | Beard | |
| 6,088,461 A | * | 7/2000 | Lin et al. | 381/104 |
| 6,246,443 B1 | | 6/2001 | Van Gestel | |
| 6,578,203 B1 | | 6/2003 | Anderson, Jr. et al. | |
| 6,931,258 B1 | | 8/2005 | Jarnstrom et al. | |
| 6,934,510 B2 | * | 8/2005 | Katayama | 455/3.06 |
| 6,941,120 B2 | | 9/2005 | Barnett et al. | |
| 6,987,946 B2 | | 1/2006 | Sinclar | |
| 7,616,099 B2 | * | 11/2009 | Mackjust et al. | 340/426.13 |
| 2004/0199933 A1 | * | 10/2004 | Ficco | 725/151 |
| 2005/0166221 A1 | * | 7/2005 | Pugel et al. | 725/33 |
| 2005/0191958 A1 | | 9/2005 | Hoskins | |
| 2005/0202788 A1 | * | 9/2005 | Vinson et al. | 455/90.3 |
| 2005/0268240 A1 | | 12/2005 | Kankaanpaa | |
| 2007/0021057 A1 | * | 1/2007 | Arseneau et al. | 455/3.06 |
| 2009/0037846 A1 | * | 2/2009 | Spalink et al. | 715/825 |
| 2011/0124337 A1 | * | 5/2011 | Lam | 455/434 |

OTHER PUBLICATIONS

RadioShack PRO-99 Deluxe Compact Rate Scanner Owner's Manual.
SC230 Owner's Manual.
Letter dated Sep. 10, 2010 from Ronald L. Panitch regarding U.S. Appl. No. 11/464,997 for the invention entitled "Radio Scanner for Sporting Events".

* cited by examiner

*Primary Examiner* — Ajibola Akinyemi
(74) *Attorney, Agent, or Firm* — Dykema Gossett PLLC

(57) ABSTRACT

A scanner for monitoring signals at one or more frequencies having a processor for performing various functionalities of the scanner in accordance with a set of instructions including a menu of selectable menu items; a display for displaying the menu items; and at least one variable selector operatively coupled to the processor for selecting menu items. The scanner also includes a receiver for receiving serial data regarding an event from a local transmitter.

27 Claims, 5 Drawing Sheets

| Car | Frequency (MHz) | Text | Subchannel | Scanning | Priority |
|---|---|---|---|---|---|
| 00 | 450.0000 | | --- | Disabled | 0 |
| 01 | 450.0000 | | --- | Disabled | 0 |
| 02 | 450.0000 | | --- | Disabled | 0 |
| 03 | 450.0000 | | --- | Disabled | 0 |
| 04 | 450.0000 | | --- | Disabled | 0 |
| 05 | 450.0000 | | --- | Disabled | 0 |
| 06 | 450.0000 | | --- | Disabled | 0 |
| 07 | 450.0000 | | --- | Disabled | 0 |
| 08 | 450.0000 | | --- | Disabled | 0 |
| 09 | 450.0000 | | --- | Disabled | 0 |
| 0 | 450.0000 | | --- | Disabled | 0 |
| 1 | 460.0125 | John Doe | 503 | Enabled | 0 |
| 2 | 450.0000 | | --- | Disabled | 0 |
| 3 | 450.0000 | | --- | Disabled | 0 |
| 4 | 450.0000 | | --- | Disabled | 0 |
| 5 | 450.0000 | | --- | Disabled | 0 |
| 6 | 450.0000 | | --- | Disabled | 0 |

*FIG. 5*

RADIO SCANNER FOR SPORTING EVENTS

CROSS REFERENCE TO RELATED APPLICATION

This application is related to Provisional Application No. 60/762,495 filed Jan. 27, 2006, the teachings of which are incorporated herein by reference.

BACKGROUND OF THE INVENTION

The invention is directed to a radio scanner for enabling spectators to monitor communications. In particular, the invention is directed to a programmable scanner which is user friendly and menu driven.

A scanner is a radio receiver capable of scanning multiple frequencies in an allotted group of frequencies associated with and licensed to participants in a particular activity. Known scanners are used for example for listening to police channels, fire and rescue channels; dispatcher channels and channels allotted to race car participants. In the latter case, channels are set to receive auto racing team communications.

Certain sporting events, such as stock car racing, allow spectators to monitor or listen in on communications between the race car driver and the pit crew and so called track spotters. The radio traffic is interesting to enthusiasts of racing, because these communications reveal information not readily available just by watching a race. Such information reveals track and car conditions, strategies, and equipment changes, and as such adds a level of enjoyment for more sophisticated spectators.

Known scanners typically scan a band of frequencies and stop or lock on any frequency which is carrying a signal. A well known example is a police radio scanner which tunes into any active frequency. In auto racing, spectators likewise tune into the band of frequencies used for such sporting events, and they listen in to communications traffic. If a particular communication is not of interest, the user may restart the scanner so that it looks for another active frequency. It is also possible to program a scanner for a particular frequency assigned to a particular racing team. The programmability currently available is not versatile or easily implemented.

It would therefore be desirable to be able to select one or more preferred frequencies of racing teams in contention for a victory while excluding teams not in contention. It would also be desirable to easily select a favorite team, particularly where the spectator follows one or more teams or drivers. It would also be desirable to be able to toggle between team channels where for example two drivers are competing head to head so as to follow the race action more closely. Other desirable enhancements would include user friendly programmability, useful displays of information, and automatic volume control. Finally, as the participants in any particular race changes from event to event it would be desirable to be able to quickly and efficiently load information pertinent to the particular event into a scanner memory, and to not have to keep extraneous information in storage, and thereby simplify navigation of the available channels during a particular event.

SUMMARY OF THE INVENTION

The present invention is based upon the discovery that a radio scanner may be combined with a processor to selectively monitor certain frequencies assigned to particular participants. The processor is programmed with instructions and functionalities selectable from a display of menu items. The processor has a memory for storing data associated with participants in the event, and includes a selector for allowing certain data to be selected for preferential monitoring, and for toggling between certain preferred frequencies. The scanner also may include a volume equalizer for producing audible output from the scanner at a selectable volume level regardless of the level of the input signal and a radio frequency input for loading event related data into memory.

BRIEF DESCRIPTION OF THE DRAWINGS

FIG. 5 is a spread sheet showing data for storage in the scanner of the invention.

DESCRIPTION OF THE INVENTION

The invention is an improved scanner which employs a variety of enhancements that make the scanner more user friendly. These enhancements include menu driven selection of functionality using one or more so called "soft" or variable keys which allow the user to select the various functions from the menu using the soft keys which change function depending on the information displayed. Functionality is enhanced by means of a Scan List function which displays the names and car numbers of the various drivers competing at a racing event through an easy-to-use menu. Additionally, the user may select or deselect all programmed channels on a separate menu. A Previous channel function allows the user to toggle between two frequencies of interest. A volume equalizer may also be employed to automatically sense the volume level of an incoming signal and adjust the volume to a selected and uniform level when listening to stations having different volume levels. A Priority menu allows the user to select and prioritize up to four preferred channels in each series. Finally, the scanner can be quickly programmed through a unique RF data transfer feature.

Figure 1:
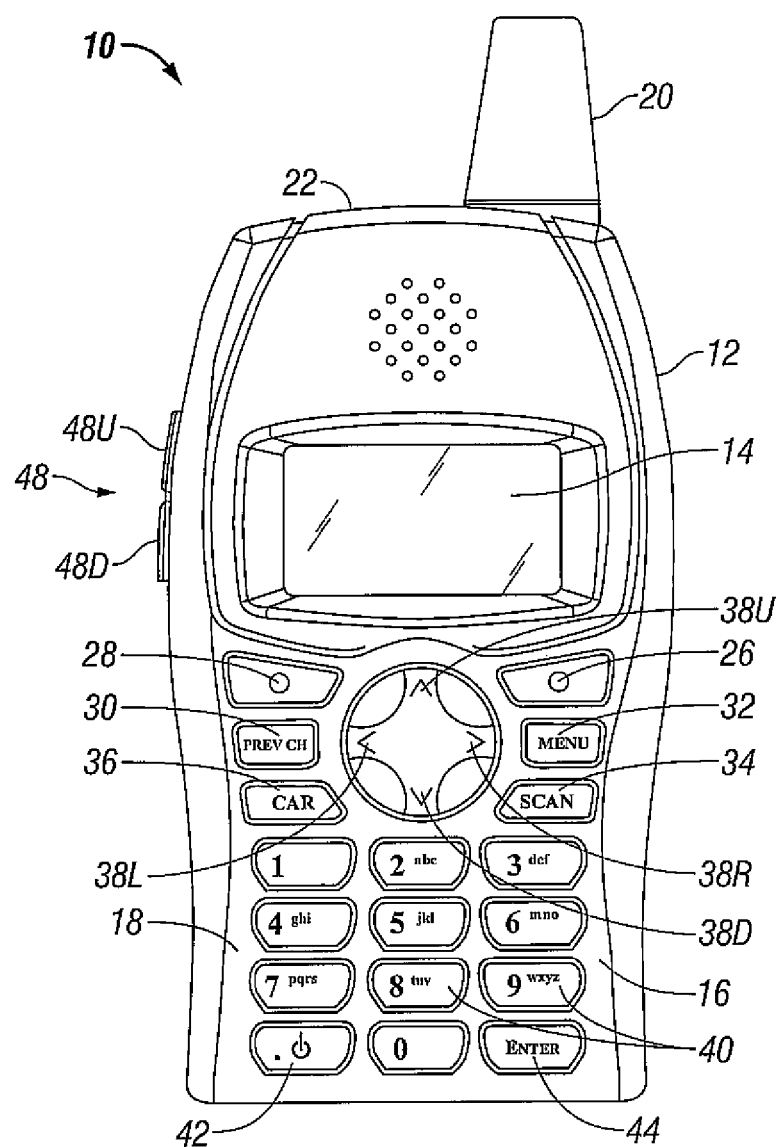
FIGS. 1 and 2 are respective front and rear views of a radio scanner in accordance with the invention.

FIG. 1 illustrates a front view of a radio scanner 10 in accordance with the invention. The scanner comprises a housing 12 having a display 14, a key pad 16; navigation controls 18; an antenna 20 and a speaker 22. According to the invention, a user is able to activate the scanner and view menu items on display 14. The key pad 16 has alpha numeric keys 40 as shown. The navigation controls 18 include respective right and left soft keys 26 and 28; a previous channel or jump key 30; a menu key 32; scan key 34; car key 36; and navigation key 38 which has respective up, down, right and left arrows 38U, 38D, 38L and 38R. A volume control 48 includes respective up key 48u and a down key 48d for raising or lowering the volume.

Figure 2:
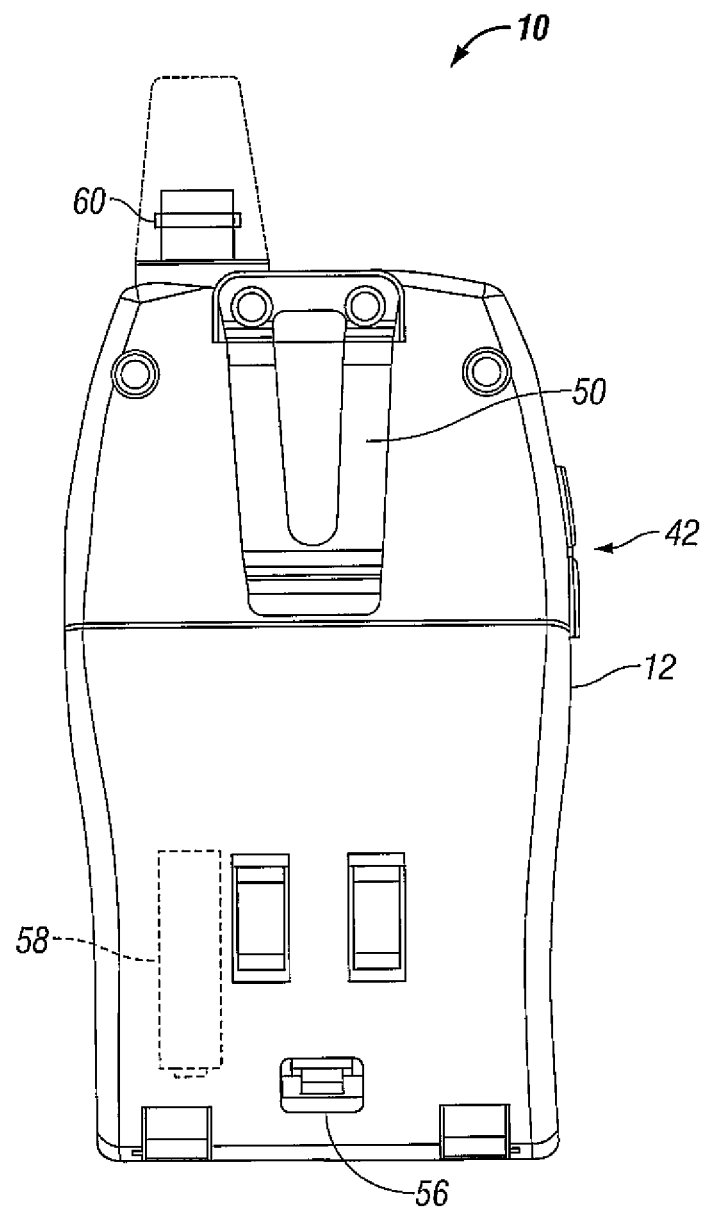

The rear of the scanner 10 shown in FIG. 2 illustrates additional features of the invention, including a belt clip 50; battery cover; cover lock 56 and batteries 58. The antenna 20 is coupled to a so called BNC connector 60.

Figure 3:
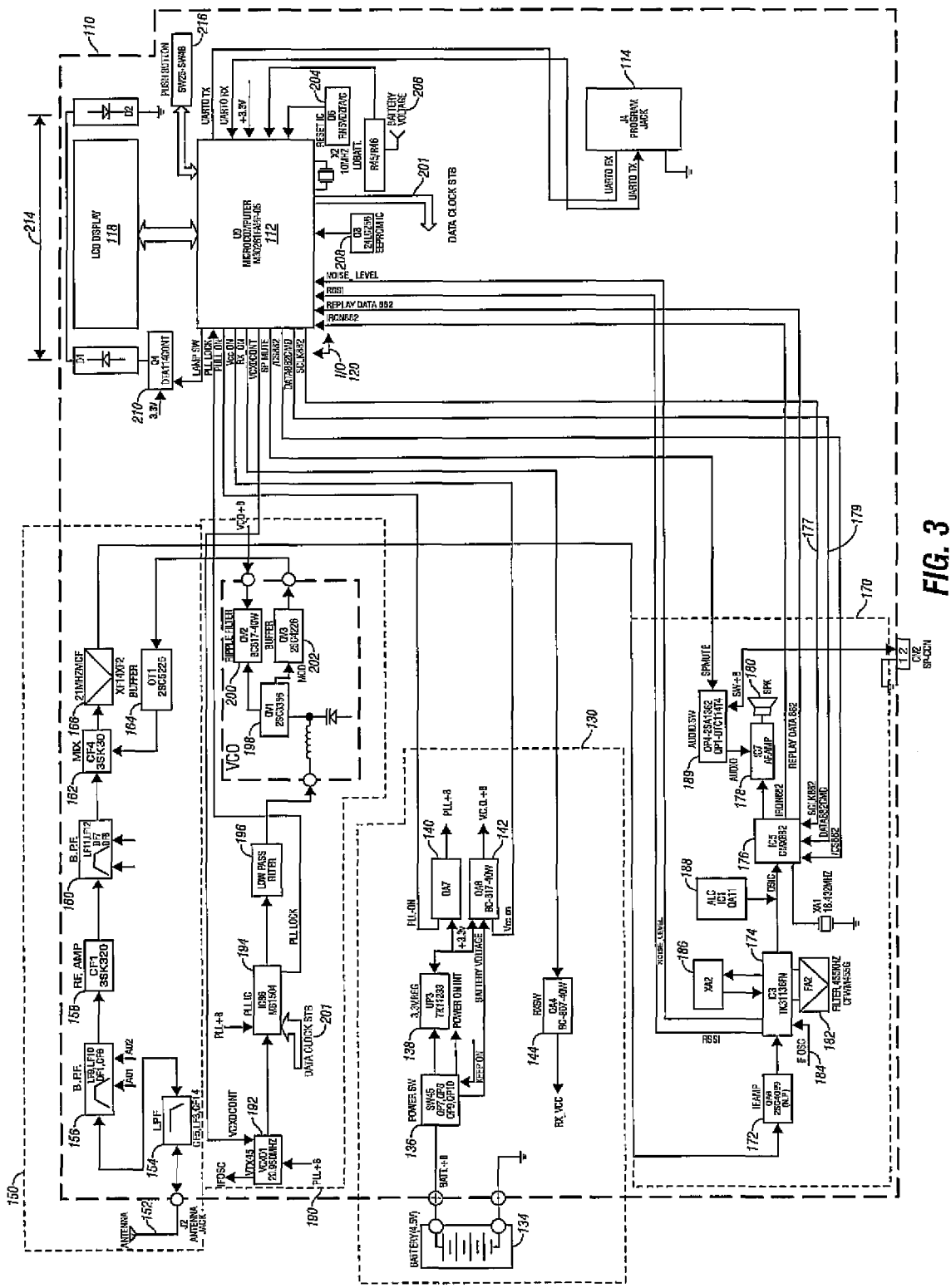
FIG. 3 is a schematic block diagram of a control circuit for the radio scanner according to the invention.

FIG. 3 is a schematic block diagram illustrating various functional blocks of a track scanner control 110 employed in the scanner 10 according to the invention. In its most general form, a microprocessor 112 is programmed with firmware adapted to perform the various functions of the scanner. The microprocessor 112 follows selected protocols to change frequencies, prioritize scan selection and to select and deselect certain frequencies. In addition, certain user preferences may be selected in advance of an event in order to enhance user enjoyment, and to enable the user to choose and pre-select particular or favorite functionalities quickly and with ease before or even during the event as standings change. The device also is quickly programmable with current team data for the event in about 60 seconds over an RF link from a Track Scan data transmitter.

The track scanner control 110 is a menu driven device comprising a firmware programmed central processing unit (CPU) 112. In the illustrative embodiment, a program input jack 114 is coupled to the CPU 112 to communicate instructions thereto. Alternatively the CPU 112 may be controlled with a software program stored in a suitable memory (not shown). The CPU has a display 118 which may be a known liquid crystal display or the like. The CPU 112 has an I/O with various inputs and outputs and outputs as shown.

A power supply 130 provides power to the CPU 112. A battery 134 feeds a power switch 136 which in turn provides s to a low voltage regulator 138, which feeds phase lock loop (PLL) power swithch 140, which in turn receives a PLL-on input from the CPU, and produces a PLL B+ output. Power switch 136 feeds VCO power swithch 142. The VCO produces an output 143 as shown.

Switch 144 fed by a power controlled pin RX-ON output of CPU 112 which produces RX_VCC output for RX power.

The scanner control 110 includes a radio receiver 150 which receives broadcast radio signals over antenna 152. These signals are transmitted by participants in the event, e.g. drivers, pit crew and the like. These signals are the conversations which take place between the drivers and their crews. Users of the scanner are thus able to listen in on the racing team action.

In order to so participate, the user must program the scanner to enable it to receive the transmissions by the various particpants, In the case of a race event, each team opeates over an assigned frequency which must be programmed. In additon, the driver name, car number and other information about each team must be programmed so that the user can find the team to monitor. This information is prepared for each event by an event host. The host stores team information in a spreadsheet memory such as the example shown in FIG. 5. This information is transmitted by the host in serial packet form to the scanner where it is received and stored in the scanner memory. Typically, using the scanner functions, described below, the user uses the transmitted data to update the scanner memory for each new event.

The receiver 150 receives signals including voice and data via antenna 152. The antenna feeds low pass filter 154 coupled to band pass filter 156, RF amplifier 158 and band pass filter 160. The output of filter 160 feeds mixer 162, which is also fed by an output of buffer 164. Crystal filter 166 receives the mixer output which in turn feeds an input to power selector circuit 170.

The power selector 170 includes an intermediate frequency amplifier 172 which feeds IC3, 174, the output of which feeds voice information to IC5 176 to input of audio amplifier 178 that drives speaker 180.

Intermediate frequency amplifier and FM detector integrated circuit 174 has an input from filter 182 and an input from intermediate frequency oscillator 184. Noise level signals from amplifier 174 feed inputs to the CPU. Discriminator 186 is coupled to amplifier for detecting the FM signal.

Auto level control (ALC) 188 feeds the input to integrated circuit 176. The circuit 176 is responsive to a clock signal 177 to control to corresponding inputs to the data clock 179. Base band processor 176 produces REPLY DATA 883 and IRQN822 inputs to CPU 112 as shown.

Data information is transmitted to the microcomputer 112 via data lines 179. This data is stored in the microcomputer memory as a table of channels with corresponding frequencies, team or driver names, car numbers and the like, as illustrated int the exemplary table shown in FIG. 5. This information is selectively displayed on the LCD display 118 by using the various functions of the scanner described below. This arrangement thereby allows the user to employ the scanner to display, track and prioritize the team information and to tune into the voice information in real time, therby enhancing the enjoyment of the event. It should be understood that, a racing event described herein is but one of many exemplay types of events which may be followed by using the scanner of the invention.

SPMUTE output of CPU 112 drives audio switch 189. The switch is coupled to AF amplifier 178. When the input signal is high, the switch 188 lowers the audio output for equalizing the speaker input. When the input signal is low, the amplifier operates at normal volume. Speaker jack 191 is coupled to the audio switch 189.

The CPU 112 provides outputs for driving a phase lock loop (PLL) circuit 190. The PLL 190 receives a voltage control signal VCX0CONT at the input to voltage controlled switch 192, which drives phase lock loop circuit 194 and low pass filter (LPF) 196. The LPF is coupled to QV1 198 which produces oscillator output for QV2, 200 and MOD output for QV3 202. The output of QV3, 202 drives buffer 164. QV2 202 produces VCO-B signal for voltage controlled oscillator (VCO) 203

Phase lock loop circuit 194 produces PLL LOCK signal for input to CPU for producing a synthesized frequency for the VCO. Circuit 196 receives a DATA CLOCK signal from auto reset 201

Auto reset 203 produces a RESET input for CPU 112

A low battery signal 206 fed by battery voltage produces a LO BATTERY signal input to CPU 112

A low battery circuit 208 responsive to a battery input produces an output to CPU 112 which indicates that the battery is low.

Driver 210 for lamp switch 211 coupled to light emitting diodes 214 illuminates the LEDs in response to the lamp switch output thereof.

Soft key 216 is coupled to the CPU and provides the versatile the soft key input therefore.

Figure 4:
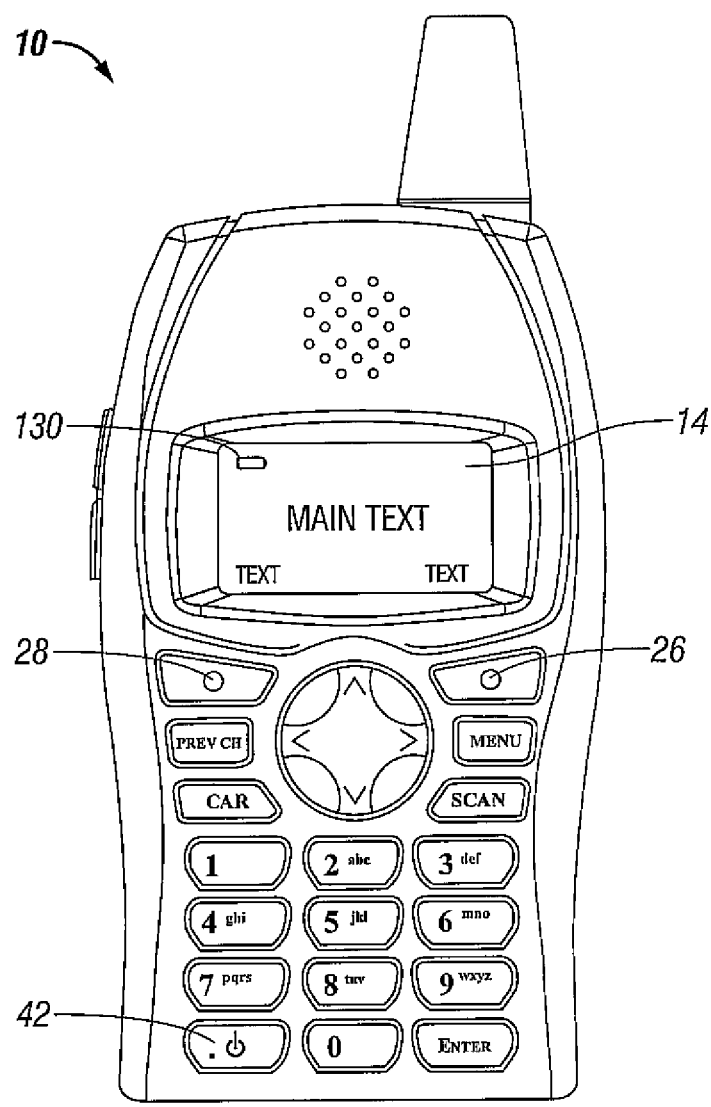
FIG. 4 is a general illustration of a display screen for selecting various menu items facilitating use of the invention.

FIG. 4 illustrates the general configuration of the screen 14. Different screens may be displayed on the LCD display. By keying in certain commands, the user may easily navigate between and among various functionalities. Operation of the scanner 10 for use in a racing application is discussed below. It should be understood that the scanner may be used for other applications, such as police and fire monitoring when suitably programmed with appropriate data.

The display 14 shows the name of the screen in the MAIN TEXT area of the screen; and shows the options as a text display directly below the MAIN TEXT. The screen 14 also displays the function of the left soft key 28 and the function of the right soft key 26 in the respective lower left and lower right portions of the screen 14 directly above the corresponding soft keys 28 and 26, as shown. It should be understood that the test dispalys change as the screens change, as discussed below. In FIG. 4 the scanner is shown with the text material located where corresponding messages; options and functions would appear.

When the scanner is OFF, the screen 14 is blank. Activation of the decimal/power key 42 (FIG. 1) turns on the scanner causing a first or WELCOME screen to appear.

The process of navigating through the various available options is achieved by following prompts and selecting menu options using left and right soft or function keys, For example, the opening screen displays WELCOME SELECT SERIES in the center of the screen and also displays a prompt: SERIES above the left soft key 28, and MENU above the right soft key 26, Selection of the MENU function by activation of the right soft key causes the screen 14 to display the main screen name MENU as text. Below the screen name is a list of options, namely SERIES; SCAN LIST; PRIORITY; PREFERENCES; and PROGRAM. For space considerations, the options are displayed two at at time, The first option, namely SERIES is highlighted by default (shown throughtout as underlined text)

The functions of the soft keys 28 and 26 displayed on the screen 14 are shown where indicated as SELECT and MENU immediately adjacent to the corresponding keys in the respective lower left and lower right part of the screen 14. When the right soft key 26 corresponding to the MENU option is activated, device is thus commanded to display: MAIN representing the screen name and a list of options namely: SERIES; SCAN LIST; PRIORITY; PREFERENCES; and PROGRAM for such screen. The screen also displays SELECT above the left soft key 28.

Various screens display the options as hereinafter discussed. However, due to space limitations on the display, certain options are shown two at a time. Accordingly, the user may actuate the respective UP/DOWN navigation key arrows 38*u*, and 38*d* of navigation key 38 to scroll through the available selections. The scroll bar highlights the options one at a time. The option first appearing at the top of the screen is highlighted, shown as underlined text, by default.

The main menu screen, MAIN, displays the SERIES by default. The SERIES option represents one or more racing series available for scanning. The remaining options represent different options. For example, SCAN LIST represents channels the user wants to scan; PRIORITY represents up to four (4) user selected channels which have particular importance to the user; PREFERENCES represents user selected options for adjusting different user selectable prefered modes; and PROGRAM represents user programming options for pogramming the device by means of communications means.

The MAIN screen as well as other selected screens display a battery icon 130 appearing in the upper left corner to indicate available battery power.

Actuation of the left soft key 28 in the MAIN menu with the SERIES option highlighted causes the SERIES menu to be displayed followed by the default series options, namely Series 1; Series 2; Series 3; AND Series 4. These four options represent various racing series available to the user for monitoring. When programmed, the default series names are replaced with the actual series name e.g. Cup or Busch. The SERIES screen also displays SELECT text above the left soft key 28.

Actuation of the SELECT soft key 28 corresponding to the highlighted key, e.g. Series 1, causes the text SCANNING followed by a series of left to right scanning arrows >>>>>> to appear in the center of the screen. The scanning arrows indicate that the scanner is looking for broadcasting channels stored in the device corresponding to the selected series.

The text STOP appears above the right soft key 26. Activation of the stop function causes the scanner to stop scanning and to lock onto the next available channel in the selected series The screen 14 then displays a screen identifying the car number, driver and frequency of the channel at which the scanner has stoped. For example the screen displays CAR 33; BURNEY LAMAR; AND 451.2500 MHz. If a small S appears below the frequency displayed, this indicates that the user has selected this frequency as avalilable for capture. In other words, if the device is scanning in the selected series, the scanner may stop at the particular entry. If the S does not appear, the scanner will skip over the frequency.

The user, in scrolling through the SCAN LIST option, may decide to remove or add cars available for capture in the scan list. Activating the MENU button 32 while stopped on a channel causes a list of options to appear on the screen, one of which is SCAN LIST. Activating the right arrow navigation key 38*r* causes the SCAN LIST table to appear, showing two entires at a time. The table shows the car number and driver dame with or without an arrow to the left of the car number. If the arrow is present, it means that the car has been selected. The screen shows a DESECLECT option below the left soft key 28 and a DONE option above the right soft key 26. If DESELECT is chosen, the arrow disappears and the car is removed from scan list availability. If DONE IS selected, the device exits the menu and returns to the display for the currently highlighted car in the scan list, showing the car number, driver name and frequency. Because the car was deselected, the S does not appear.

Returning to the previous screen by selecting MENU button 32 followed by the right arrow 38*r*, causes the previously deselected car and driver to appear. The screen displays SELECT above the left soft key 28 and DONE above the right soft key 26. Activating SELECT reinstates the arrow symbol and thereby adds the driver to the list.

In the SCAN LIST menu, the user may choose to activate the MENU key 32 on the front of the scanner just below the right soft key 26. Activation of the MENU key causes the scanner to display options, namely SELECT ALL; SELECT NONE; and MAIN. This menu is a short cut to allow the user to choose all of the available cars in the SCAN LIST, or to select none or to return to the main menu. To select one of these options, the user uses the right arrow key 38*r*, which causes the screen to display the function. For example depressing the right arrow key while the SELECT ALL option is highlighted as shown, causes the screen to display SELECTING ALL. After all the cars are selected the screen reverts to the SCAN LIST. If the list is scrolled, all cars will show an arrow 134 to the left, indicating all have been selected.

Likewise if SELECT NONE is highliged and activated, the screen displays SELECTING NONE. When complete, the screen reverts the SCAN LIST, but all the arrows are deleted. The user may easily revert to the preivious screen by selecting the MENU key and designating the SELECT ALL option.

Finally the user may revert to the MAIN menu by using the up/down key 38*u*/38*d* to highlight MAIN and the right arrow key to choose MAIN, whereby the screen reverts to the MAIN.

Once the user returns to the MAIN menu, the user may scroll down and highlight and select the PRIORITY option, which causes the list of drivers to appear. This display shows, two at a time the car number and driver name. To the left of the highlighted car number, a blank space appear. A priority number may be assigned to the space. The number is an integer from 1 to 4. This number 136 represents one of four available priority designations that the user may assign to any four cars.

The priority number determines the priority of the selection. For example, prioirty 1 is higher than prioirty 4; and any priority number is higher than no prioirty at all. If a user is on any non prioirty channel, and a proirity signal is detected, the prioirty signal will take over. If the user is on a priority channel; if a higher priority is detected, the higher prioirty signal will take over.

Activating the left soft key 28 below the SELECT option causes the number, if present, to disappear. Likewise, activating the left soft key 28 for a highlighted car number causes a number 1-4 to reappear. If four cars have been selected, activation of the select key will not cause a number 136 to appear, because no more prioirty channels are available. Accordingly, another of the already selected cars must be deselected, by highlighting the entry and activating the SELECT option, which causes the number to disappear. Thereafter another driver or car may be selected for prioirty status by scrolling to it and choosing the SELECT option. At the completion of selections from the PRIORITY menu, the user presses the right soft key 26,designated Done, to return to the MAIN menu.

The user may then scroll to highlight and select the PREFERENCES option from the MAIN menu, whereupon the screen shows the PREFERENCES screen and the corresponding preferences options: LIGHT; SQUELCH; PRIORITY SCAN; and SCAN DELAY. These are shown two at a time. Also shown is the SELECT option over the left soft key 28.

The LIGHT option displays the screen for enabling backlighting of the display. There are three choices: ON WHEN RECEIVING; OFF; and ALWAYS ON. The left soft key 28 is used to choose the SELECT option for the currently highlghed choice, whereupon an arrow appears to the left of the selection. If another option has already been selected, the arrow shifts to the newly selected option. As usual, the user may scroll to highlight and then select the desired option, and the user may return to the PREFERENCES screen by selecting the right soft key 26 designated DONE.

The SQUELCH option in the preferences menu is selected by scrolling down to the option to highlight and activateing the left soft key 28, which causes the SQUELCH LEVEL screen to appear. In the screen, three options are shown, namely LOW; MID and SENSITIVE. An arrow appears to the left of the selected option, e.g. LOW. To choose another selection the user simply scrolls to highlight the desired selection and then presses the left soft key 28 to select the new choice, whereupon the arrow appears next to the new selection, and is extinguished next to the prior selection. Actuating the right soft key 26 for the DONE option returns to the PREFERENCES menu.

At the PREFERENCES menu, the user may scroll to the PRIORTY SCAN menu which displays ON; and OFF options along with SELECT and DONE functions above the respective left and right soft keys 28 and 26.

Selection of ON enables the priorty scan function to operate, whereby the 1-4 selected prioirity cars are scanned frequently over all other selected cars in the scan list. The user scrolls to the ON or OFF option using the navigation key 38 and the SELECT option enables the option selected. Thereafter the user selects the DONE function to return to the PREFERENCES screen.

From the PREFRENCES menu, the user may scroll down to highlight and select the SCAN DELAY option causing the available options: 1 SECOND; 2 SECONDS; and 3 SECONDS to appear. SELECT and DONE likewise appear as noted above. The arrow appearing to the left of one of the available options, e.g. 1 SECOND, indicates that such option is the currently operative or selected option. To change the current SCAN DELAY, the user scrolls to highlight another choice, and selects by activating the SELECT function above the left soft key 28. The arrow appears next to the new choice and disappears from the prioir choice. Activation of the DONE function above the right soft key 26 causes the screen to return to the PREFERENCES menu.

The SCAN DELAY is the amount of time the scanner dwells on a selected frequency following termination of signal. For example, the scanner stops on the next active channel in the scan list, as modified by the preferences option, and resumes scanning when the signal at which the scanner is locked ends. The SCAN DELAY causes the scanner to pause or remain locked on to the current channel for a selected interval after the signal ends. The pause or scan delay allows the scanner to remain locked on during periods between to and fro conversations For example, the crew chief asks the driver "How are the tires functioning?". The driver, understandably, may pause to think of an appropriate response, during which time there is no signal. The SCAN DELAY function allows the scanner to dwell on the channel for a short period without resuming scanning as soon as the signal drops out. In other words, the scan delay option allows for the channel to be without signal giving the driver time to think. Accordingly, the SCAN DELAY feature allows time for a response. In other words, with SCAN DELAY, the scanner will not resume scanning immediately, giving the driver a chance to respond within the set delay time. After setting the SCAN DELAY parameter, the user may revert to the PREFERENCES menu by activating the DONE option over the right soft key 26.

The PREFERENCES choices are now complete, and the user may return to the MAIN menu by activating the MENU key 32, whereupon the MAIN menu screen appears.

The user may then scroll down to highlight and select the PROGRAM menu which displays options: AIRWAVE; KEYPAD; RXCABLE; TXCABLE; SERIES; and DELETE ALL two at a time; and displays the SELECT function. Using the navigation key and left soft key below the displayed SELECT function, the user may choose the AIRWAVE option. The AIRWAVE option allows the user to enable the scanner to be programed over the air. When selected the AIRWAVE function enables the scanner to receive a radio signal broadcast at the event site.

When selected, the text appearing in the center of the display is: WAITING FOR DATA, and the function CANCEL appears above the right soft key 26. The text advises the user that the receiver is available to receive broadcast data from a sponsored local source provided at the race track or event.

When programming is complete in AIRWAVE mode, the text message PROGRAMMING COMPLETE automatically appears on the display indicating that programming has been successfully completed. The screen may then be returned to the PROGRAM menu by selection of the BACK function above the right soft key 26.

The user may at any time elect to abort the AIRWAVE programming sequence by pressing the CANCEL function below the right soft 26, whereupon the text message PROGRAMMING ABORTED appears. Selecting the BACK function above the right soft key 26 causes the screen to revert to the PROGRAM menu.

The user may scroll down to select the KEYPAD option on the PROGRAM menu. This screen prompts the user to manually ENTER CAR NO. By using the alpha nuneric keys, a car number may be enterd to appear on the screen. Exercising the ENTER function above the left soft key 28 causes the car number to appear along with a text message prompting the user to ENTER FREQUENCY. A seven digit default frequency appears in the display. A cursor appears in the displayed frequency. By activating the navigation key, the selected digit on the the display above the cursor may be changed by activating the up and down arrow keys 38U/38D. Activating the left and right arrow keys 38L/38R moves the cursor left or right. Activating the NEXT function above the right soft key 26 causes the next car in the scan list to appear. Activating the ENTER function above the left soft key 28 causes a prompt ENTER CTCSS CODE to appear.

The options for ENTER CTCSS CODE are a three digit number or OFF. The up/down key 38 toggles between the available options. The ENTER function above the left soft key 28 enters the highlighted selection and moves the display to a screen displaying ENTER ALPHA LABEL. Using the keyboard, the user may enter text. Selecting the DONE option above the left soft key 28 returns the screen to the PROGRAM menu. Selecting the NEXT function, moves the screen to the next car.

The scroll function of the left and right arrow keys 38*l*, 38*r* is used for moving the cursor 144 on the screen. The key pad is used to enter alpha numeric information at the selected cursor location and the left soft key ENTER function enters the data.

The user may return to the program screen by selecting DONE on the Enter Alpha Label screen which takes the user to the PROGRAM screen. The user may select the RXCABLE option shown. This screen allows the user to download track and driver information frequencies and the like from a pc. The screen instructs the user to CONNECT CABLE AND PRESS RECEIVE WHEN READY. When RECEIVE function is selected above the left soft key 28, the screen informs the user that the scanner is receiving the data. Actuating the left soft key 28 starts the transfer of data. Actuation of the CANCEL function above the right soft key 26 cancels or aborts the transfer.

The user may return to the PROGRAM screen and scroll to the TXCABLE option. The user is prompted to CONNECT CABLE PRESS TRANSMIT WHEN READY. Selection of the TRANSMIT function above the left soft key causes the device to disply the text message- TRANSMITTING. When complete, the displays shows a text message PROGRAMMING COMPLETE. Activation of the right soft key 26 aborts the transmission.

The user may then move to the SERIES option menu. Selection of the SERIES option displays the Series names. After selecing a series the text message ENTER ALPHA LABEL displays. A small display: abc in the upper left of the display instructs the user to use the alpha keys to change the name of the displayed series. Using the right/left scroll key 38*l-r* moves the cursor to the letter or letters to be changed. Ths screen prompts the user to enter the alpha label, which may be done with the alpha keys and then entered using the left soft key 28. As noted above, the screen shows lower case abc in the upper left corner of the display, indicating that the key pad is in lower case mode. The DONE function above the left soft key 28 enters the data and sends the display to the SERIES option in the PROGAM menu.

After entering the SERIES data, the user may select the DELETE ALL screen in the PROGRAM menu. As shown, if the user selects this option using the SELECT function above the left soft key 28, the screen text displays ARE YOU SURE? In order to confirm the selection. If the user selects the NO option, the selection is disabled and the screen reverts to the DELETE ALL Option. If the selection is YES, the text DELETING appears indicating that the system is DELETING. In this mode all the data is deleted and the scanner is available to be programmed with new data from AIRWAVE or RXCABLE or through the keypad as desired by the user.

According to the invention, other functions may be added to the device described herein. The invention allows for greater flexibility in programing and using track scanners and the like. In particular, navigating the data stored in the device is enhanced and simplified by means of the soft keys which change with different screen displays and readily prompt the user to monitor the available channels with relative ease.

What is claimed is:

1. A scanner for monitoring signals at one or more frequencies comprising:
    a radio receiver for receiving information transmitted on a channel corresponding to one of said one or more frequencies;
    a processor configured to recover said information transmitted on said channel when said scanner is tuned to said one of said one or more frequencies, and to perform various functionalities of the scanner in accordance with a set of instructions including first and second menus of selectable menu items;
    a display, wherein said processor is configured to control said display to display said selectable menu items of said first and second menus; and
    at least one variable selector operatively coupled to the processor for selecting, in response to a user actuation of said variable selector, at least one of said selectable menu items of said first menu when said first menu is displayed on said display, and at least one of said selectable menu items of said second menu when said second menu is displayed on said display,
    and wherein said first menu comprises a selectable Main menu displayed on said display for selecting among a plurality of main menu options including a first option, a second option, a third option, a fourth option, and a fifth option, and wherein said processor is configured to control said display to display said selectable Main menu and said plurality of main menu options; and
    wherein said second menu comprises the first option, and wherein said first option comprises selectable menu items for multiple series representing racing events, and wherein said processor is configured to control said display to display said selectable menu items of said first option;
    wherein said second menu comprises the second option, and wherein said second option comprises a list of car and associated driver options participating in a racing event, and wherein said processor is configured to control said display to display said list of car and associated driver options, and wherein said list of said second option comprises a selectable list of car and associated driver options for selecting and deselecting at least one of said car and associated driver options in said list that is to be scanned, and wherein said processor is configured to control said display to display said selectable list of car and associated driver options; and
    wherein said second menu comprises the third option, and wherein said third option comprises a plurality of selectable driver scanning selections having a scanning rate higher than remaining driver selections, and wherein said processor is configured to control said display to display said plurality of selectable driver scanning selections of said third option.

2. The scanner of claim 1 further including a volume equalizer configured to automatically sense the volume level of a received signal and to produce an audible output at a selectable volume level regardless of the volume level of said received signal.

3. The scanner of claim 1 further comprising a memory for the processor and a scan list stored in the memory, said scan list including data identifying various frequencies as being associated with a source of the signals transmitted at the corresponding frequency.

4. The scanner of claim 1 further including a selector for enabling the scanner to toggle between any two most recently selected frequencies.

5. The scanner of claim 1 wherein said second menu comprises the fourth option, and wherein said fourth option comprises a plurality of selections including Light; Squelch; and Priority Scan control options, and wherein said processor is configured to control said display to display said plurality of selections of said fourth option.

6. The scanner of claim 5 wherein the Light option comprises a third menu of selectable menu items, said selectable menu items of said Light option are for selecting or deselecting at least one of a plurality of options for lighting the display, and wherein said processor is configured to control said display to display said at least one of said a plurality of options for lighting the display.

7. The scanner of claim 5 wherein the Squelch option comprises a third menu of selectable menu items, said selectable menu items of said Squelch option are for selecting a squelch level of the scanner, and wherein said processor is configured to control said display to display at least one selectable squelch level option.

8. The scanner of claim 5 wherein the Priority Scan comprises a selector for enabling and disabling the Priority option, and wherein said processor is configured to control said display to display said selector.

9. The scanner of claim 5 wherein said fourth option further comprises a Scan Delay control option, the Scan Delay control option comprises a selectable time delay between scanning times, and wherein said processor is configured to control said display to display at least one selectable time delay option.

10. The scanner of claim 1 wherein said second menu comprises the fifth option, and wherein said fifth option includes programming options including Airwave; Keypad; RXCable; TXCable; Series; and Delete All options, and wherein said processor is configured to control said display to display said programming options.

11. The scanner of claim 10 wherein the Airwave option comprises a selection for allowing the scanner to be programmed over a radio frequency, and further wherein said scanner further comprises a memory for said processor and a receiver for receiving radio broadcast data, said receiver configured to receive data comprising predetermined information used to program said scanner and to communicate said data to said memory, said memory configured to store said data.

12. The scanner of claim 10 wherein the RXCable option comprises a selection for allowing the scanner to be programmed over a cable link.

13. The scanner of claim 10 wherein the TXCable option comprises a selection for allowing the scanner to btransmit data over a cable link.

14. The scanner of claim 10 wherein the Series option of the programming options comprises a selectable option for allowing the manual editing of a name of at least one of a plurality of series names representing racing events.

15. The scanner of claim 10 wherein the Delete All option comprises a selection for allowing the scanner to delete data.

16. The scanner of claim 10 including a key pad for programming the scanner and wherein the Key Pad option of the programming options comprises a selection for allowing the scanner to be programmed over said key pad.

17. The scanner of claim 16, wherein said processor is configured to control said display to display a series of steps for programming said scanner over said key pad.

18. The scanner of claim 1 wherein said scanner is configured to scan a set of predetermined frequencies corresponding to a selected one of said selectable menu items of said first option for multiple series representing racing events.

19. The scanner of claim 1 wherein the at least one variable selector is operative to perform select; deselect; done; cancel; transmit; back; enter; and next functions.

20. The scanner of claim 19 wherein the at least one variable selector has associated therewith a function as displayed on the display.

21. The scanner of claim 20 wherein the display for the at least one variable selector varies in accordance with available options.

22. The scanner of claim 1 wherein said radio receiver is configured to receive at least one of a plurality of available channels in a selected band of frequencies.

23. The scanner of claim 1 further including a radio receiver for receiving data regarding an event on a current basis over a radio link.

24. The scanner of claim 1 further including a memory for storing data, said data being associated and updateable in connection with a sporting event to be monitored, said data being received and stored by the scanner in response to a control signal.

25. The scanner of claim 1, wherein said second menu comprises the third option, and wherein said third option comprises a list of selectable driver scanning options wherein any one of said selected driver scanning options may be selected to be any one of a plurality of priority levels, and wherein said processor is configured to control said display to display said list of selectable driver scanning options.

26. The scanner of claim 1, further comprising a navigation key operatively coupled to the processor for scrolling through said selectable menu items of said first menu when said first menu is displayed on said display, and said selectable menu items of said second menu when said second menu is displayed on said display.

27. The scanner of claim 1, wherein said at least one of said selectable menu items of said first menu is a first menu item, and said at least one of said selectable menu items of said second menu is a second menu item different than said first menu item.

* * * * *

UNITED STATES PATENT AND TRADEMARK OFFICE
CERTIFICATE OF CORRECTION

| | |
|---|---|
| PATENT NO. | : 8,478,217 B2 |
| APPLICATION NO. | : 11/464997 |
| DATED | : July 2, 2013 |
| INVENTOR(S) | : Glen Aikenhead |

It is certified that error appears in the above-identified patent and that said Letters Patent is hereby corrected as shown below:

In the Claims

Column 11, line 55 (Claim 13), "btransmit" should be --transmit--

Signed and Sealed this
Twentieth Day of August, 2013

Teresa Stanek Rea
*Acting Director of the United States Patent and Trademark Office*